United States Patent
Jeong

(10) Patent No.: US 10,454,048 B2
(45) Date of Patent: Oct. 22, 2019

(54) FLEXIBLE DISPLAY DEVICE

(71) Applicant: LG Display Co., Ltd., Seoul (KR)

(72) Inventor: Hae-Yeon Jeong, Osan-si (KR)

(73) Assignee: LG Display Co., Ltd., Seoul (KR)

( * ) Notice: Subject to any disclaimer, the term of this patent is extended or adjusted under 35 U.S.C. 154(b) by 227 days.

(21) Appl. No.: 15/690,516

(22) Filed: Aug. 30, 2017

(65) Prior Publication Data

US 2018/0062092 A1 Mar. 1, 2018

(30) Foreign Application Priority Data

Aug. 31, 2016 (KR) .......................... 10-2016-0112240

(51) Int. Cl.
| | | |
|---|---|---|
| *G06F 3/041* | (2006.01) | |
| *H01L 51/00* | (2006.01) | |
| *G06F 3/044* | (2006.01) | |
| *H01L 27/32* | (2006.01) | |

(52) U.S. Cl.
CPC .......... *H01L 51/0097* (2013.01); *G06F 3/044* (2013.01); *G06F 3/0412* (2013.01); *H01L 27/323* (2013.01); *G06F 2203/04102* (2013.01); *G06F 2203/04103* (2013.01); *G06F 2203/04111* (2013.01); *G06F 2203/04112* (2013.01); *H01L 2227/326* (2013.01); *H01L 2251/5338* (2013.01)

(58) Field of Classification Search
CPC ............................ G06F 3/0412; H01L 51/0097
See application file for complete search history.

(56) References Cited

U.S. PATENT DOCUMENTS

| | | | |
|---|---|---|---|
| 9,287,329 B1* | 3/2016 | Lee ...................... | H01L 51/0097 |
| 2002/0063332 A1* | 5/2002 | Yamaguchi ......... | H01L 23/3114 |
| | | | 257/738 |
| 2006/0107143 A1* | 5/2006 | Kim ...................... | G09G 3/3233 |
| | | | 714/726 |
| 2006/0146034 A1 | 7/2006 | Chen et al. | |
| 2009/0033609 A1* | 2/2009 | Ashizawa ............. | G02F 1/1345 |
| | | | 345/92 |
| 2013/0162552 A1 | 6/2013 | Huang et al. | |

(Continued)

FOREIGN PATENT DOCUMENTS

| | | |
|---|---|---|
| CN | 104656990 A | 5/2015 |
| EP | 2704197 A1 | 3/2014 |

(Continued)

OTHER PUBLICATIONS

Extended European Search Report issued in counterpart European Patent Application No. 17188739.1 dated Feb. 7, 2018.

(Continued)

*Primary Examiner* — William Boddie
*Assistant Examiner* — Andrew B Schnirel
(74) *Attorney, Agent, or Firm* — Morgan, Lewis & Bockius LLP

(57) ABSTRACT

Disclosed is a flexible display device in which a flexible film is first patterned and in a subsequent process of removing a glass substrate, a structure around the flexible film is removed therewith by external physical force, in order to make the device slim. In the flexible display device, the edge structure of the flexible film may be changed to minimize the generation of particles on the cut plane of the flexible film, thereby preventing damage to the periphery of the flexible film.

18 Claims, 9 Drawing Sheets

(56) References Cited

U.S. PATENT DOCUMENTS

| | | | |
|---|---|---|---|
| 2014/0062916 A1 | 3/2014 | Hong et al. | |
| 2014/0104185 A1* | 4/2014 | Hu | G06F 3/041 |
| | | | 345/173 |
| 2015/0346869 A1 | 12/2015 | Jang | |
| 2016/0246419 A1 | 8/2016 | Jiang et al. | |

FOREIGN PATENT DOCUMENTS

| | | |
|---|---|---|
| EP | 2991116 A1 | 3/2016 |
| EP | 3016168 A1 | 5/2016 |
| JP | 2014-206885 A | 10/2014 |
| KR | 10-2012-0049708 A | 5/2012 |
| TW | 476122 B | 2/2002 |
| TW | 200625175 A | 7/2006 |
| TW | M506322 U | 8/2015 |
| WO | 2015/104295 A1 | 7/2015 |

OTHER PUBLICATIONS

Office Action issued in counterpart Taiwanese Patent Application No. 10720245580 dated Mar. 20, 2018.

\* cited by examiner

FLEXIBLE DISPLAY DEVICE

This application claims the benefit of Korean Patent Application No. 10-2016-0112240, filed on Aug. 31, 2016, which is hereby incorporated by reference as if fully set forth herein.

BACKGROUND

Technical Field

The present invention relates to a display device, and more particularly, to a flexible display device in which an auxiliary pattern is provided on the boundary of a flexible film, from which a glass substrate is removed, thereby preventing any damage.

Discussion of the Related Art

Recently, as the information age has fully arrived, the field of displays that visually display electrically conveyed information signals has developed rapidly. In response to this, various kinds of flat panel display devices having excellent characteristics, such as a small thickness, a low weight, and low power consumption, have been developed and have rapidly replaced existing cathode ray tubes (CRTs).

Concrete examples of such flat panel display devices may include, for example, a liquid crystal display (LCD) device, an organic light-emitting display (OLED) device, a plasma display panel (PDP) device, and a field emission display (FED) device Among these, an organic light-emitting display device is considered to be a competitive application because it requires no separate light source and realizes device compactness and vivid color display.

Such an organic light-emitting display device includes self-luminous elements, such as organic light-emitting elements, provided in sub-pixels, and performs display via operation of the organic light-emitting elements on a per sub-pixel basis. In addition, the organic light-emitting elements may be used as self-luminous elements in a lighting apparatus as well as the display device, and thus the development of organic light-emitting elements has recently been in the spotlight in the lighting industry. In addition, because the organic light-emitting elements require no separate light source unit, they are also advantageously used in a flexible display device or a transparent display device.

A flexible display device is gradually thinning and developing to a foldable form. In addition, the flexible display device has been proposed for use in a form to which a touchscreen is added so as to display a screen in response to direct user input.

Meanwhile, when such a flexible display device is realized in a form to which a touchscreen is added, an array forming process is performed on a glass substrate, and thereafter the glass substrate is removed, in order to achieve a slim design and flexibility. However, in the process of removing the glass substrate, damage due to particles generated on a scribing line has been observed.

SUMMARY

Accordingly, the present invention is directed to a flexible display device that substantially obviates one or more problems due to limitations and disadvantages of the related art.

An object of the present invention is to provide a flexible display device in which an auxiliary pattern is provided on the boundary of a flexible film, from which a glass substrate is removed, thereby preventing any damage.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a flexible display device comprises a flexible film, which is divided into an active area and a dead area around the active area, an electrode array provided in the active area of the flexible film, a pad portion provided in the dead area of the flexible film and having a plurality of pad electrodes, a routing wire configured to connect the electrode array and the pad electrodes, a plurality of transparent dummy electrode wires provided from the pad electrodes to an edge of the flexible film, and a plurality of dummy metal patterns, wherein each of the dummy metal pattern is in contact one-to-one with the transparent dummy electrode wires and is provided to the edge of the flexible film by a width greater than a width of each of the transparent dummy electrode wire.

In another aspect, a flexible display device comprises a first flexible film, which is divided into an active area and a dead area around the active area, a touch electrode array provided in the active area of the first flexible film, a touch pad portion provided in the dead area of the first flexible film and having a plurality of touch pad electrodes, a routing wire configured to connect the touch electrode array and the touch pad electrodes, a plurality of transparent dummy electrode wires provided from the touch pad electrodes to an edge of the first flexible film, a plurality of dummy metal patterns, wherein each of the dummy metal pattern is in contact one-to-one with the transparent dummy electrode wires and is provided to the edge of the first flexible film by a width greater than a width of each of the transparent dummy electrode wires, a second flexible film having a thin-film transistor and an organic light-emitting diode array disposed so as to face the touch electrode array, and an adhesive layer between the organic light-emitting diode array and the touch electrode array.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION

Figure 1:
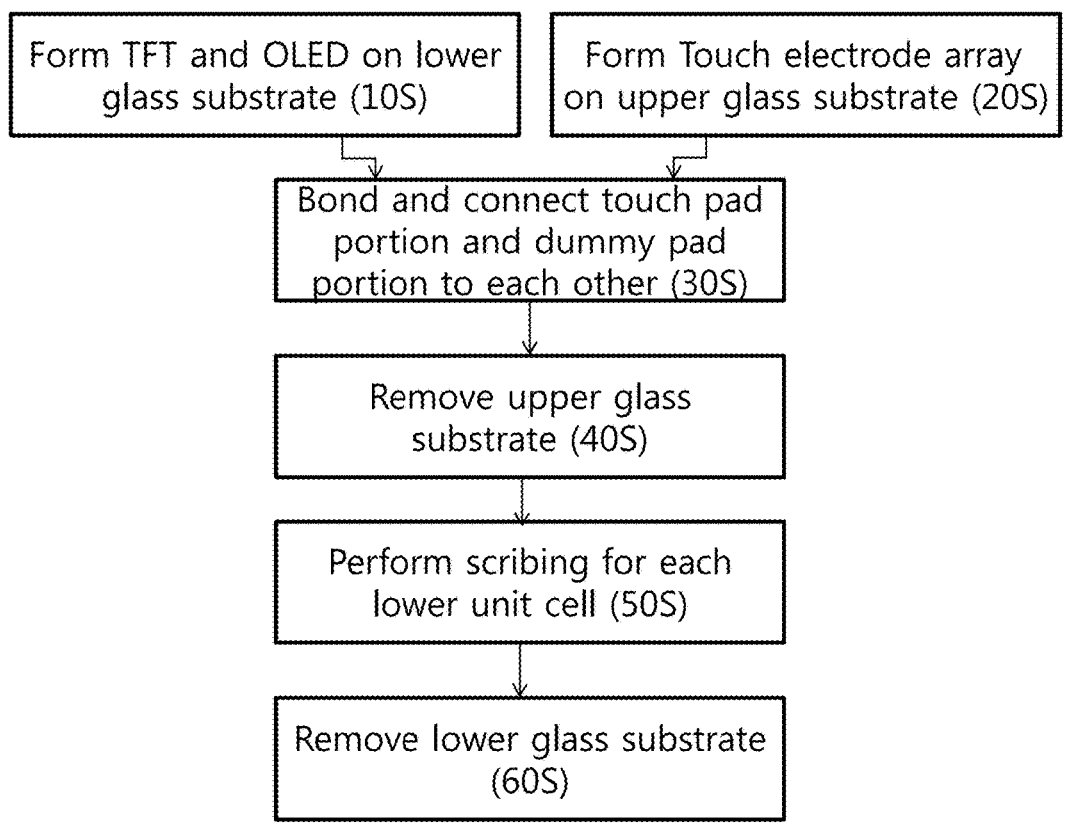
FIG. 1 is a process flowchart illustrating a method of manufacturing a flexible display device of the present invention.

Hereinafter, embodiments of the present invention will be described in detail with reference to the accompanying drawings.

The embodiments of the present invention are provided in order to allow the technical sprit of the present invention to be sufficiently transferred to those skilled in the art, and thus the present invention may be embodied in other forms and is not limited to the embodiments described below. In addition, in the drawings, for example, sizes and thicknesses of devices, layers and areas may be exaggerated for clarity of description. The same reference numbers will be used throughout the drawings to refer to the same or like parts.

The advantages and features of the present invention and the way of attaining them will become apparent with reference to embodiments described below in detail in conjunction with the accompanying drawings. The present invention, however, are not limited to the embodiments disclosed hereinafter and may be embodied in many different forms. Rather, these exemplary embodiments are provided so that this disclosure will be through and complete and will fully convey the scope to those skilled in the art. The scope of the present invention should be defined by the claims.

It will be understood that, when an element or a layer is referred to as being "on" another element or layer, it can be directly on the other element or layer, or intervening elements or layers may also be present. On the other hand, when an element such as a layer, film, region or substrate is referred to as being "directly on" another element, this means that there are no intervening elements therebetween.

Spatially relative terms, such as "beneath," "below," "lower," "above," "upper," and the like may be used herein for ease of description to describe the relationship of one element or components to another element or other components, as illustrated in the drawings. It will be understood that the spatially relative terms are intended to encompass different orientations of the device in use or operation in addition to the orientation depicted in the figures. For example, when an element illustrated in the drawings is inverted, an element described as being located "below" or "beneath" another element may be placed "above" the other element. Accordingly, the exemplary term "below" or "beneath" may include both upper and lower directions.

The terms used in this specification are provided to describe the embodiments, and thus are not intended to limit the present invention. In this specification, the singular forms are intended to include the plural forms as well, unless the context clearly indicates otherwise. It will be further understood that the terms "comprises" and/or "comprising", when used in this specification, specify the presence or addition of stated components, steps, operations and/or elements, but do not preclude the presence or addition of one or more other components, steps, operations and/or elements.

Figure 2:
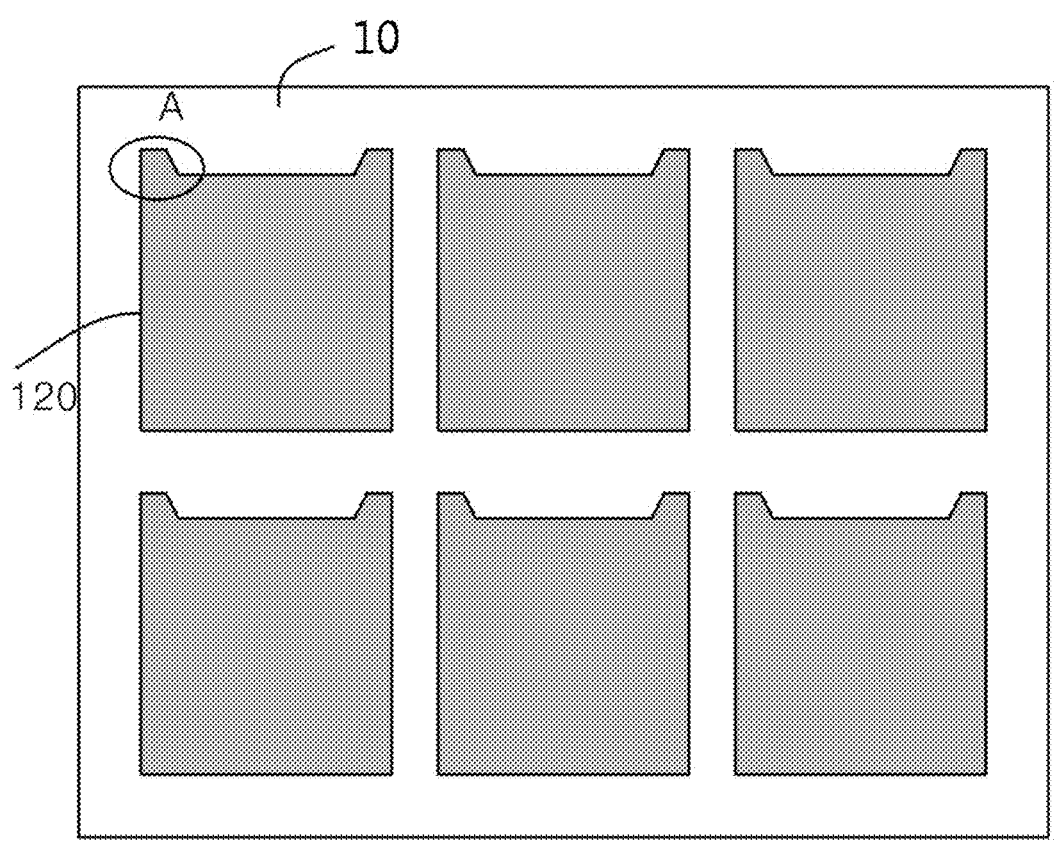
FIG. 2 is a plan view illustrating an upper glass substrate and a first flexible film in the method of manufacturing the flexible display device of the present invention.
Figure 3A:
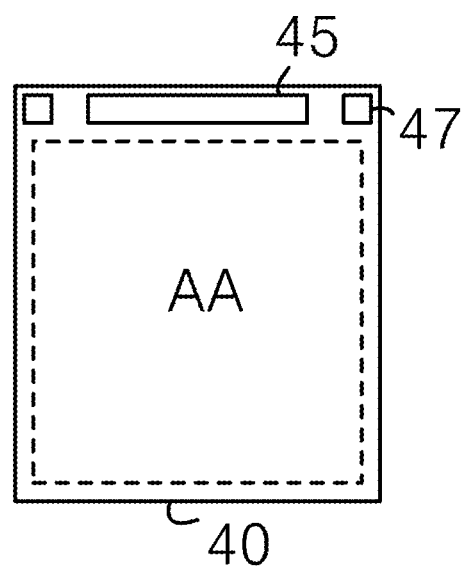
FIGS. 3A to 3C are plan views illustrating a first flexible film, a second flexible film, and the bonded state of the first and second flexible films in the method of manufacturing the flexible display device of the present invention.
Figure 3B:
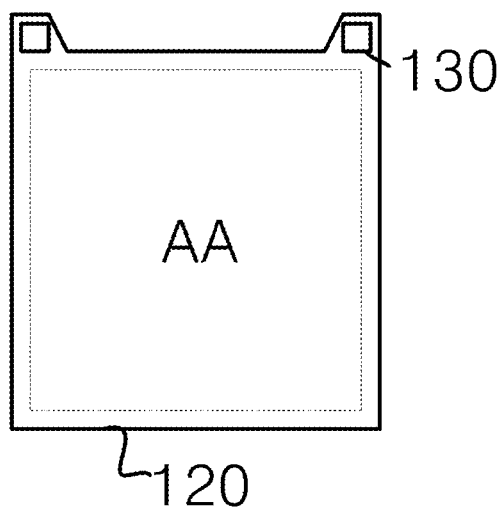
Figure 3C:
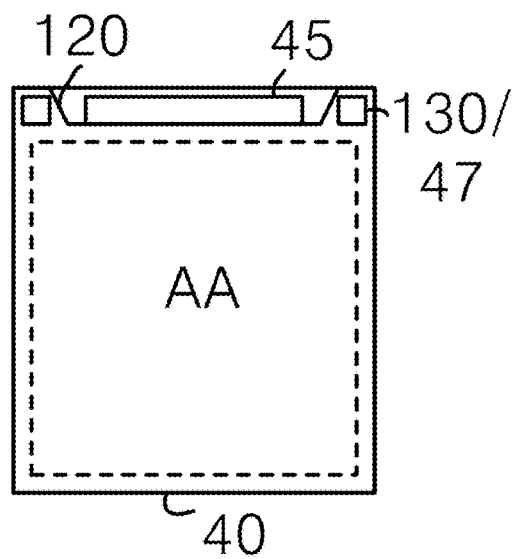

FIG. 1 is a process flowchart illustrating a method of manufacturing a flexible display device of the present invention. In addition, FIG. 2 is a plan view illustrating an upper glass substrate and a first flexible film in the method of manufacturing the flexible display device of the present invention, and FIGS. 3A to 3C are plan views illustrating a first flexible film, a second flexible film, and the bonded state of the first and second flexible films in the method of manufacturing the flexible display device of the present invention.

As illustrated in FIG. 1, the method of manufacturing the flexible display device of the present invention is performed in the following sequence.

On the side of a lower glass substrate (not illustrated), a thin-film transistor (TFT) array and an organic light-emitting diode array connected thereto are formed for each TFT base unit cell 40 (10S).

Specifically, after the lower glass substrate (not illustrated) is provided, a second flexible film (see 41 in FIG. 11) is applied onto the lower glass substrate. Then, as illustrated in FIG. 3A, the thin-film transistor array is formed thereon for each TFT base unit cell 40. Each TFT base unit cell 40 includes a central active area AA and a peripheral area around the active area AA, and a portion of the peripheral area along one side has a relatively large area so that a TFT pad portion 45 is provided in the relatively large area. A pair of dummy pad portions 47 is provided on opposite sides of the TFT pad portion 45. The TFT base unit cell 40 is not individually separated in the process of forming the thin-film transistor array, and only an area for the same is defined on the lower glass substrate. That is, in the process of forming the thin-film transistor array, the second flexible film is not yet patterned, but is integrally formed on the lower glass substrate, which is a mother substrate having a plurality of TFT base unit cells 40, and the thin-film transistor array is formed for each TFT base unit cell 40. Then, the organic light-emitting diode (OLED) array is formed above the thin-film transistor array. In this case, the active area AA is divided into a plurality of sub-pixels, and the thin-film transistor array and the organic light-emitting diode array are connected to each other in the TFT base unit cell 40 for each sub-pixel.

As illustrated in FIG. 2, after an upper glass substrate 10 is provided, a sacrificial layer (not illustrated, see 50 in FIGS. 7A to 7C) is formed on the upper glass substrate 10, and thereafter, a first flexible film 120 is applied thereon and is then patterned for each touch base unit cell via photo-processing. Subsequently, as illustrated in FIG. 3B, a touch electrode array (see 200 in FIG. 11) is formed in the active area AA for each touch base unit cell, and a touch pad portion 130 is formed in a portion of the peripheral area around the active area AA (20S). Here, while the touch electrode array (see 200 in FIG. 11) and the touch pad portion 130 are formed, the first flexible film 120 remains on the upper glass substrate 10.

Meanwhile, the first flexible film 120 is a colorless organic film, which has a small thickness within a range from about 0.5 µm to 10 µm and is formed of, for example, photo-acryl or polyimide. The first flexible film 120 is not a separately attached film, but is a thin film formed by applying a material onto the glass substrate. Accordingly, the first flexible film 120 is much thinner than a general individual plastic film and contributes to the flexibility of the flexible display device.

Subsequently, as illustrated in FIG. 3C, the touch electrode array and the organic light-emitting diode array (see 310 in FIG. 11) are disposed so as to face each other so as to be bonded to each other with an adhesive layer (see 400 in FIG. 11) interposed therebetween (30S).

Subsequently, the upper glass substrate 10 is removed via laser irradiation (40S).

Subsequently, each TFT base unit cell 40 is scribed into the shape illustrated in FIG. 3A (50S), and the lower glass substrate is removed via laser irradiation (60S). With the process described above, there is formed a panel in which the TFT base unit cells 40 and the second flexible film 120 are bonded to each other for each unit cell.

As illustrated in FIG. 3C, the bonded panel, from which the upper and lower glass substrates have been removed, has a final shape in which the first flexible film 120 is open in a region corresponding to the pad portion of the TFT base unit cell 40 and thus is smaller than the TFT base unit cell 40.

Figure 4:
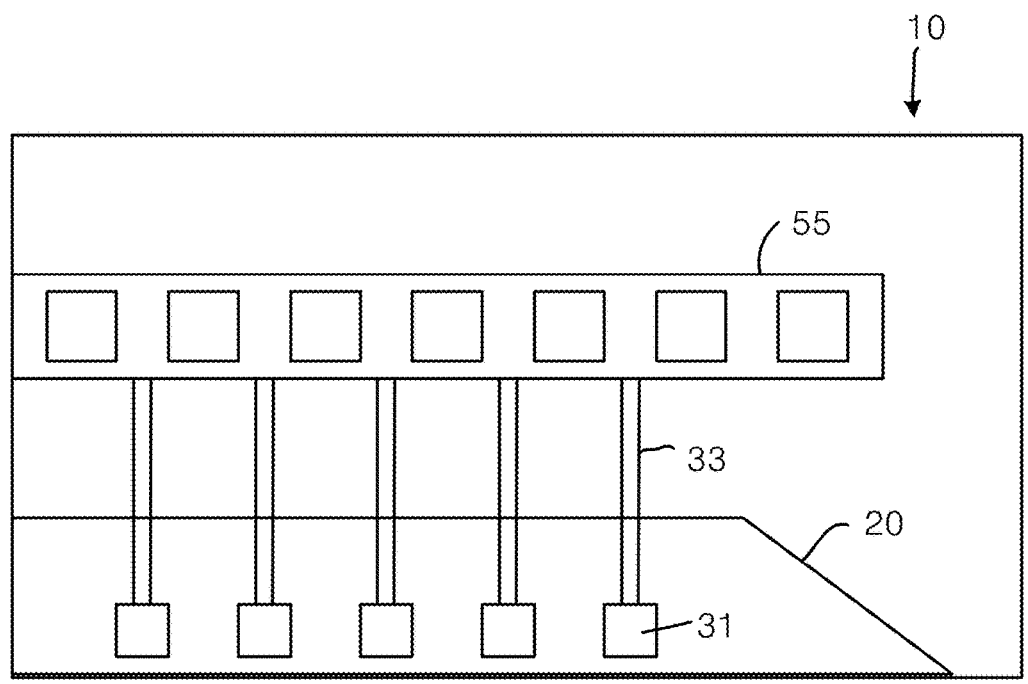
FIG. 4 is an enlarged plan view illustrating area A of FIG. 2 according to a comparative example.
Figure 5:
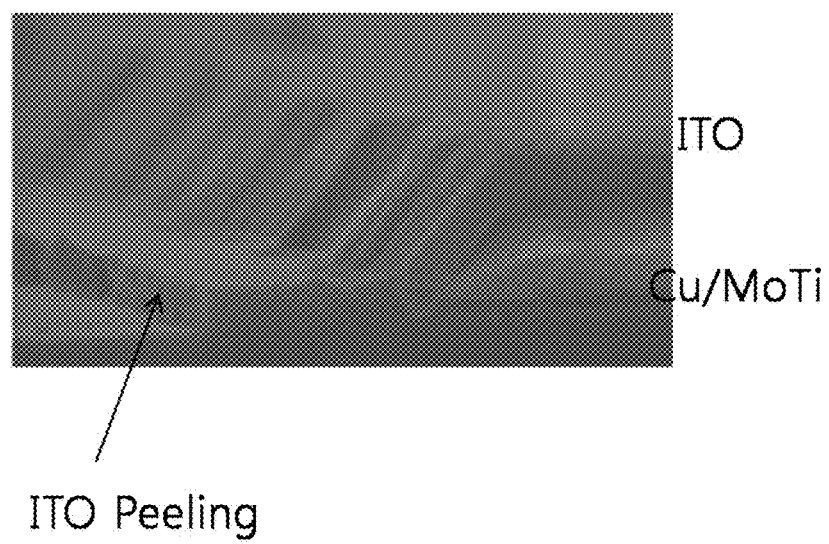
FIG. 5 is a photograph illustrating a peeling phenomenon of a transparent electrode, which occurs on the cut plane of a first flexible film in the comparative example.

FIG. 4 is an enlarged plan view illustrating area A of FIG. 2 according to a comparative example, and FIG. 5 is a photograph illustrating a peeling phenomenon of a transparent electrode, which occurs on the cut plane of the first flexible film in the comparative example.

Considering the above-described manufacturing method, after the first flexible film 120, on which the touch electrode array is disposed, is patterned via photo-processing such that the shape thereof is determined for each unit cell, the array forming process is performed.

In the comparative example, as illustrated in FIG. 4, a shorting bar 55 is directly formed on an upper glass substrate 10 outside a patterned first flexible film 20, in order to prevent the generation of static electricity during a manufacturing process. The shorting bar 55 is connected to a touch pad electrode 31, which is located inside the first flexible film 20, via a connection wire 33.

In a subsequent process of removing the upper glass substrate, when the first flexible film 20 is physically divided for each touch base unit cell, for example, the shorting bar 55 is separated from the first flexible film 20.

The connection wire 33 may be divided into a portion that is disposed on a portion in which the first flexible film 20 is formed and a portion that is directly formed on the upper glass substrate 10, rather than the first flexible film 20. In this structure, when the upper glass substrate 10 is removed using a laser, in the area in which the first flexible film 20 is directly formed on the upper glass substrate 10, the connection wire 33 reacts with the laser that has passed through the transparent upper glass substrate 10. At this time, particles may break off by reaction with high laser energy, causing damage to structures on the first flexible film 20.

For example, because the connection wire 33 is formed of a transparent electrode such as ITO, which is integrally connected and is formed of a transparent material, in the process of removing the upper glass substrate 10 via laser irradiation, as illustrated in FIG. 5, both the portion of the connection wire 33 that is directly disposed on the upper glass substrate 10 outside the first flexible film 20 and the portion of the connection wire 33 that is directly disposed on the first flexible film 20 are peeled off. As such, the touch pad electrode 31 connected to the peeled connection wire 33 is vulnerable and is at risk of malfunction upon a touch operation.

Meanwhile, in FIG. 5, "Cu/MoTi" not described above may be the touch pad electrode 31.

The flexible display device of the present invention is devised to solve the above-described problem, and prevents such damage and the peeling of the connection wire by changing the configuration of the cut plane of the first flexible film.

First, in the flexible display device of the present invention, the configuration of the top of the second flexible film before the removal of the upper glass substrate and after the formation of the touch electrode array will be described.

Figure 6:
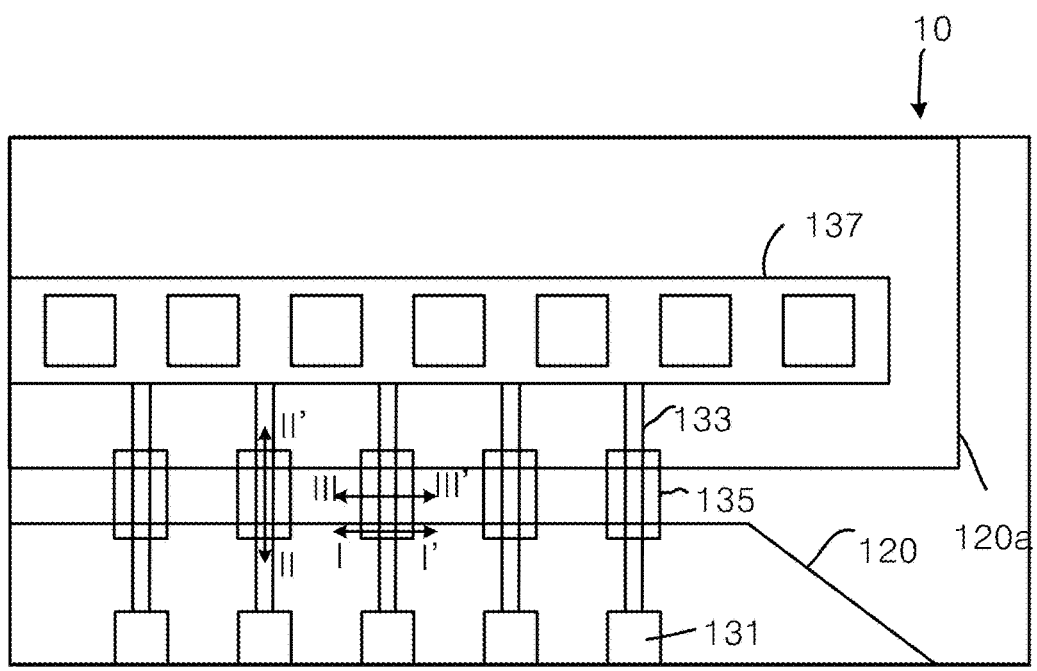
FIG. 6 is an enlarged plan view illustrating area A of FIG. 2 according to the flexible display device of the present invention.
Figure 7A:
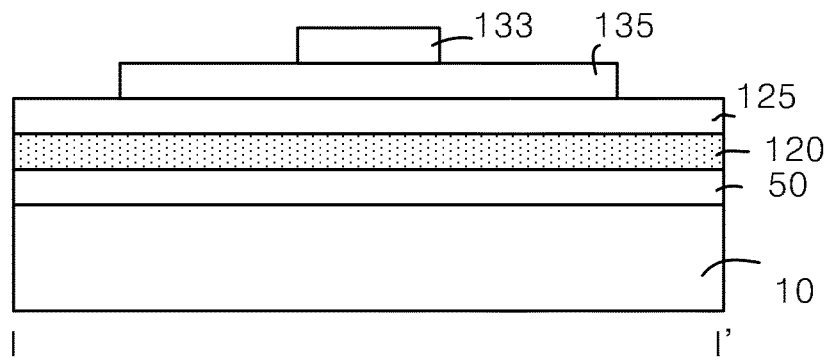
FIGS. 7A to 7C are cross-sectional views taken along line I-I', line II-II' and line III-III' of FIG. 6.
Figure 7B:
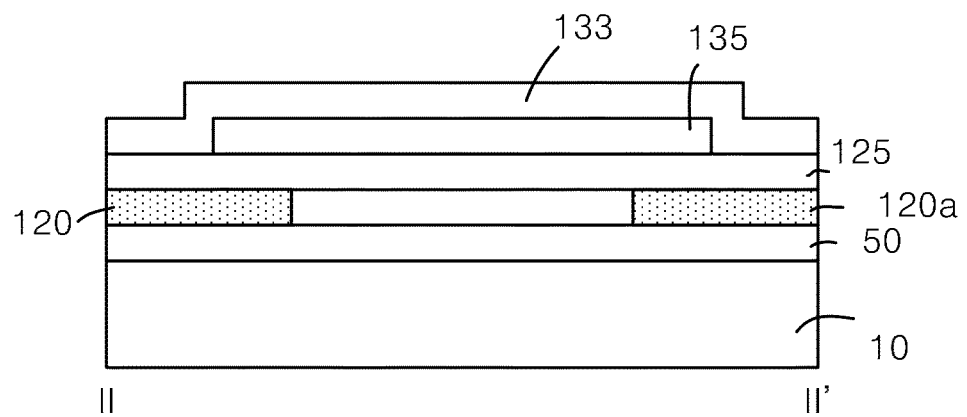
Figure 7C:
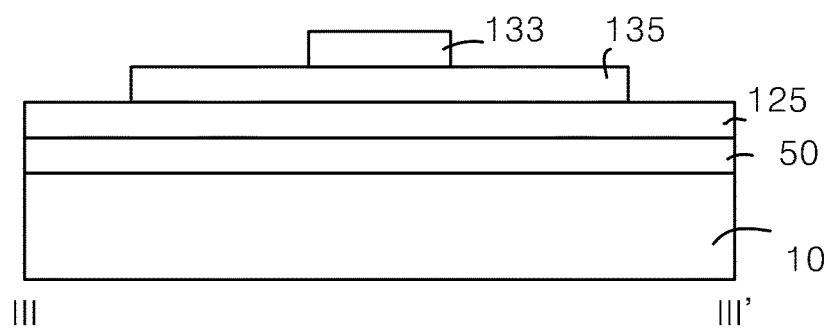

FIG. 6 is an enlarged plan view illustrating area A of FIG. 2 according to the flexible display device of the present invention, and FIGS. 7A to 7C are cross-sectional views taken along line I-I', line II-II' and line III-III' of FIG. 6.

As illustrated in FIG. 6, FIGS. 7A to 7C and FIG. 8, the flexible display device of the present invention includes the first flexible film 120, which is divided into the active area AA and a dead area around the active area AA, the electrode array 200, which is provided in the active area AA of the first flexible film 120, the touch pad portion 130, which is provided in the dead area of the first flexible film 120 and has a plurality of touch pad electrodes 131, routing wires 127, which interconnect the electrode array 200 in the active area AA and the touch pad electrodes 131, transparent dummy electrode wires 133, which extend from the touch pad electrodes 131 to a shorting bar 137 so as to pass through the edge of the first flexible film 120, and dummy metal patterns 135, which are in contact both with one surface of the respective transparent dummy electrode wires 133 and with the edge of the first flexible film 120, and each of which has a width greater than that of the transparent dummy electrode wire 133.

Here, the area illustrated in FIG. 6 corresponds to an upper protrusion of the first flexible film 120 in the plan view of FIG. 3B, and corresponds to the touch pad portion 130 on one side and the area close thereto. On the upper glass substrate 10, each of the dummy metal patterns 135 is located on both the first flexible film 120 and a dummy base 120a, which are separated from each other. The dummy metal patterns 135 and the transparent dummy electrode wires 133 pass through the dummy base 120a, and the transparent dummy electrode wires 133 are connected to a shorting bar 137 on the dummy base 120a. The shorting bar 137 has a shape in which transparent electrodes, which are in the same layer as the transparent dummy electrode wires 133, and dummy metal patterns form island-shaped stacks. In this case, the transparent dummy electrode wires 133 are integrally formed with the transparent electrodes of the shorting bars 137.

The shorting bar 137 functions to prevent static electricity from being generated in the touch electrode array forming process.

In addition, in the touch electrode array forming process, the first flexible film 120 is disposed above the upper glass substrate 10 with the sacrificial layer 50 interposed therebetween.

Because the first flexible film 120 may be exposed outward when the upper glass substrate 10 is removed, the inner surface thereof, on which the touch electrode array will be formed, is provided with a plurality of inorganic buffer layers 125. Thereafter, the touch electrode array 200 is formed thereon.

The first flexible film 120 is patterned into the shape illustrated in FIG. 6 so as to be separated from the dummy base 120*a* before the formation of the touch electrode array. Then, in the process of forming the touch electrode array, the dummy metal patterns 135 are formed in the same layer as a metal mesh pattern so as to extend onto both the first flexible film 120 and the dummy base 120*a*. The dummy metal patterns 135 may be a stack of light-shielding metal materials, for example, a Cu layer and a MoTi layer, which may exhibit little or no reactivity with laser energy upon laser irradiation. In another example, the dummy metal patterns 135 may be a Mo/Al stack, a Ti/Al/Ti stack, or any other metal layers or metal stack having low laser reactivity.

The touch pad electrodes 131 and the dummy metal patterns of the shorting bar 137 on the dummy base 120*a* may be provided in the same layer as the dummy metal patterns 135. The dummy metal patterns 135 are located between the first flexible film 120 and the dummy base 120*a*, which are separated from each other, and are also located to overlap facing ends of the first flexible film 120 and the dummy base 120*a*.

The transparent dummy electrode wires 133 are provided so as to pass through the top of the dummy metal patterns 135 and to be connected to the touch pad electrodes 131 and the shorting bar 137. Here, the transparent dummy electrode wires 133 have a width smaller than that of the dummy metal patterns 135 and are covered with the light-shielding dummy metal patterns 135, thereby not being affected by a laser upon laser irradiation.

In addition, the dummy metal patterns 135 are spaced apart from the touch pad electrodes 131 at a predetermined distance, and are electrically separated from the touch pad electrodes 131. For example, the dummy metal patterns 135 may have an island shape. The dummy metal patterns 135 serve as reinforcement patterns for preventing damage to or any negative effect of the transparent dummy electrode wires 133 formed inside the first flexible film 120 during laser processing, and are floating patterns to which no electrical signals are applied.

For example, a protective layer may be further formed above the transparent dummy electrode wires 133. In some cases, an anisotropic conductive film may pass over the pad portion 130 so as to spread to the upper side of the transparent dummy electrode wires 133 in a pressing process. The touch pad portion 130 meets a dummy pad portion (see 47 in FIG. 11) on the side of the second flexible film 41 on which the thin-film transistor array and the organic light-emitting diode array (see 310 in FIG. 11) are disposed so as to face each other. In this area, the touch pad electrodes 131 of the upper touch pad portion 130 and dummy pad electrodes of the lower dummy pad portion may be connected to each other via an anisotropic conductive film (see 450 in FIG.

The transparent dummy electrode wires 133 are conductive connection patterns for interconnecting the touch pad electrodes 131 and the shorting bar 137 at opposite sides thereof, unlike the above-described dummy metal patterns 135 having an island shape.

Figure 8:
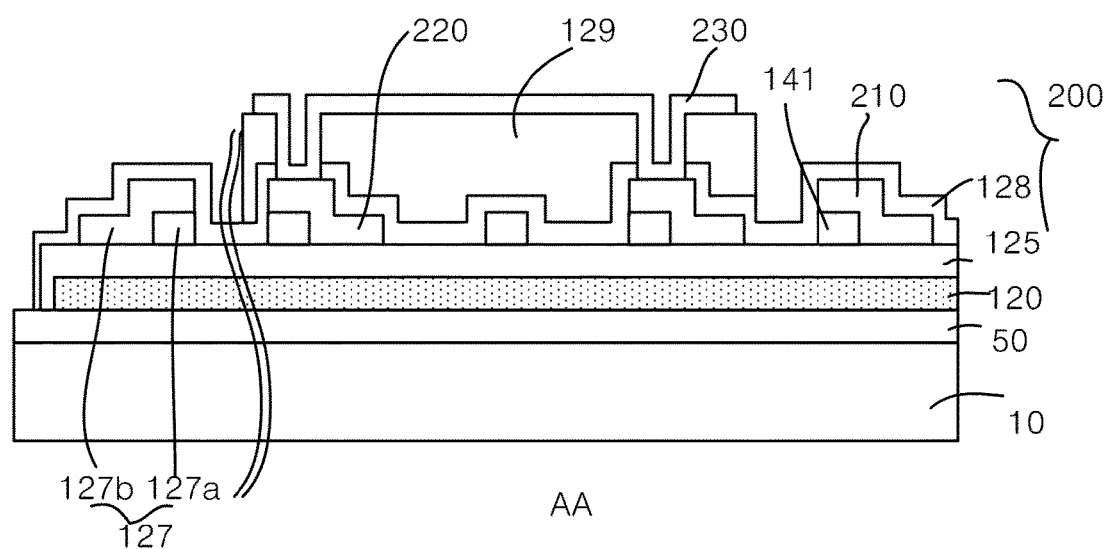
FIG. 8 is a cross sectional view illustrating a touch electrode array and a routing wire of the flexible display device of the present invention.

FIG. 8 is a cross sectional view illustrating the touch electrode array and the routing wire of the flexible display device of the present invention.

Specifically, considering the configuration of the touch electrode array 200 located in the active area AA with reference to FIG. 8, after the sacrificial layer 50 is provided on the upper glass substrate 10 and the one or more inorganic buffer layers 125 are provided on the sacrificial layer 50, a metal mesh 141 is provided on the inorganic buffer layers 125 and is connected to first and second electrodes 210 and 220, which have a lattice shape so as to cross each other and serve to receive and apply signals. The metal mesh 141 may be formed in double layers including a Cu layer and a MoTi layer, and may be formed in the same process as the above-described dummy metal patterns 135. However, the metal mesh 141 serves to assist in reducing the resistance of the first and second electrodes 210 and 220 and may be visible in the active area AA when having a large width. Therefore, in order to prevent this, the metal mesh 141 has a width smaller than that of the first and second electrodes 210 and 220 in the active area AA.

Here, the first and second electrodes 210 and 220 may be disposed above the metal mesh 141, and the metal mesh 141 and the first and second electrodes 210 and 220 may be patterned together using the same halftone mask or the same multi-tone mask. The first and second electrodes 210 and 220 may be formed of transparent electrodes such as, for example, ITO, IZO, IGZO or ITZO, and may be formed in the same process as the transparent dummy electrode wires 133.

A first interlayer insulation layer 128, which is formed of an inorganic layer, and a second interlayer insulation layer 129, which is formed of an inorganic layer, are provided to cover the metal mesh 141 and the first and second electrodes 210 and 220. The second electrodes 220 are spaced apart from each other in the same layer via a contact hole formed in the first interlayer insulation layer 128 and the second interlayer insulation layer 129, and the respective neighboring second electrodes 220 are electrically connected to each other via a bridge electrode 230.

Meanwhile, the routing wire 127 may be formed by stacking a first layer 127*a*, which is formed of a metal, and a second layer 127*b*, which is formed of a transparent electrode, one above another. The second layer 127*b* may have a larger width so as to cover the first layer 127*a*, which serves to allow the second layer 127*b*, which is formed of a transparent electrode, to protect the metal first layer 127*a* thereunder, thereby preventing corrosion of the first layer 127*a*. The first layer 127*a* and the second layer 127*b* of the routing wire 127 are formed respectively in the same processes as the dummy metal patterns 135 and the transparent dummy electrode wires 133.

Meanwhile, in the flexible display device of the present invention, for the slim design and flexibility of the device, after the touch electrode array (see 200 in FIG. 11) and the routing wire 127 are formed, the upper glass substrate 10 located thereunder, which serves as a mother substrate, is removed.

The upper glass substrate 10 is separated from the first flexible film 120 as the sacrificial layer 50 is burned by radiating a laser from the lower side of the upper glass substrate 10. In this case, the first flexible film 120 has been patterned on the upper glass substrate 10 so as to be separated from the dummy base 120*a*. When the upper glass substrate 10 is removed, the dummy base 120*a*, which is a structure around the first flexible film 120, is removed along with the upper glass substrate 10.

In this case, the dummy metal patterns 135 are located close to the side that is irradiated with the laser, thereby preventing laser energy from being transferred to the transparent dummy electrode wires 133 thereabove, which may prevent the generation of transparent electrode particles during laser irradiation, resulting in stabilized processing.

Figure 9:
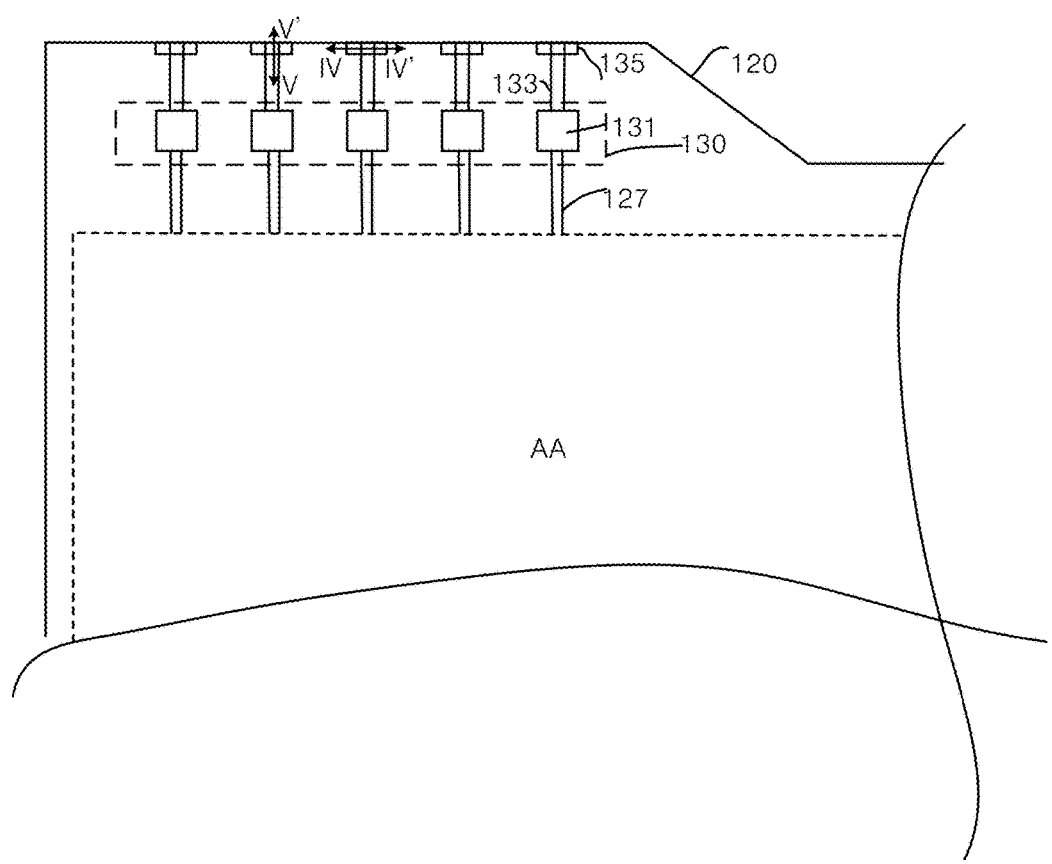
FIG. 9 is a plan view illustrating the state after the removal of the upper glass substrate of the flexible display device of the present invention.
Figure 10A:
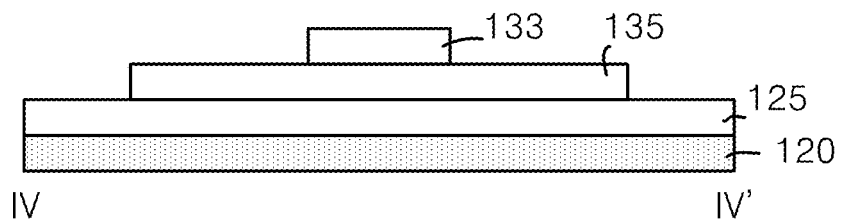
FIGS. 10A and 10B are cross-sectional views taken along line IV-IV' and line V-V' of FIG. 9.
Figure 10B:
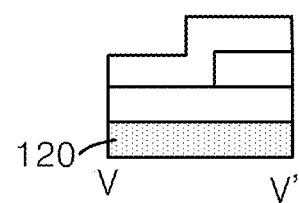

FIG. 9 is a plan view illustrating the state after the removal of the upper glass substrate of the flexible display device of the present invention, and FIGS. 10A and 10B are cross-sectional views taken along line IV-IV' and line V-V' of FIG. 9.

As illustrated in FIGS. 9 to 10B, after the upper glass substrate 10 is removed via laser irradiation, the patterned first flexible film 120 undergoes lateral separation at the boundary thereof, whereby the dummy metal patterns 135 are cut along the edge of the first flexible film 120 to thereby remain thereon.

That is, a portion of each dummy metal pattern 135 that has a width greater than that of the corresponding transparent dummy electrode wire 133 remains so as to be in contact with the edge of the first flexible film 120, and the transparent dummy electrode wire 133 remains on the dummy metal pattern 135 so as to be electrically connected thereto.

Accordingly, while the upper glass substrate 10 is removed via laser irradiation, the inorganic layers 125 and other layers thereabove, which are located outside the first flexible film 120 and have no surface for the formation or attachment of an organic layer, are removed along with the upper glass substrate 10, whereby the edge of the first flexible film 120 undergoes lateral separation.

Meanwhile, although the above-described example has described the dummy patterns on the edge of the flexible film including the touch electrode array (touchscreen), the present invention is not limited thereto and may be applied to all edges so long as the shape of the flexible film is defined before the glass substrate is removed.

Figure 11:
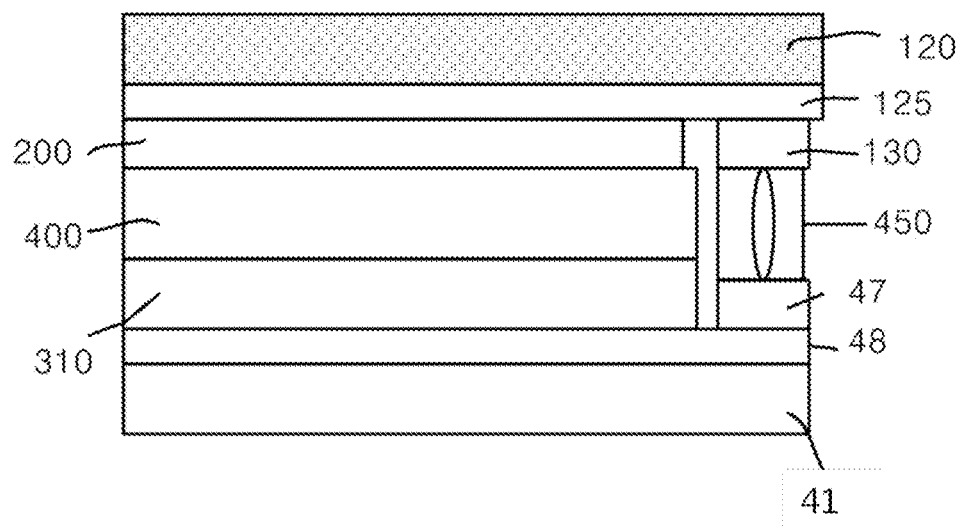
FIG. 11 is a cross-sectional view illustrating the flexible display device of the present invention.

FIG. 11 is a cross-sectional view illustrating the flexible display device of the present invention.

As illustrated in FIG. 11, the flexible display device of the present invention includes the first flexible film 120, which is divided into the active area AA and the dead area around the active area AA, the touch electrode array 200, which includes the first and second electrodes 210 and 220 provided in the active area AA of the first flexible film 120 so as to cross each other, the touch pad portion 130, which is provided in the dead area of the first flexible film 120 and has the touch pad electrodes 131, the routing wires 127, which interconnect the touch electrode array 200 and the touch pad electrodes 131, the transparent dummy electrode wires 133, which extend from the touch pad electrodes 131 to the edge of the first flexible film 120, the second flexible film 41, which is disposed facing the touch electrode array 200 and has the thin-film transistor array and the organic light-emitting diode array 310, and the adhesive layer 400, which is provided between the thin-film transistor array and the organic light-emitting diode array 310 and the touch electrode array 200.

Here, the second flexible film 41 may be a colored flexible film, which is formed of, for example, polyimide or photoacryl, and may be separated from the lower glass substrate via a scribing process immediately before the lower glass substrate is removed.

Meanwhile, reference numeral "48" not described above is an inorganic buffer layer, which may serve to prevent damage to the second flexible film 41 when the thin-film transistor array and the organic light-emitting diode array 310 are formed on the second flexible film 41, and may include a plurality of layers.

As may be understood from the above description, a flexible display device of the present invention may use flexible films as the planes on which a thin-film transistor array, an organic light-emitting diode array and a touch electrode array are disposed, in order to reduce the thickness of the device. In addition, an array forming process is performed in the state in which the flexible films are applied onto upper and lower glass substrates, in order to prevent damage to the flexible films, which are vulnerable to heat, during the array forming process. Because the flexible film on the upper glass substrate is thin and is formed on the upper glass substrate via a coating process, the flexible film may be patterned to determine the shape thereof before the array forming process. Accordingly, the array forming process is applied to the patterned flexible film. When metal dummy patterns having a large width are formed on the edge of the flexible film during the array forming process, it is possible to prevent particles from breaking off from structures under and around the flexible film, which are removed along with the glass substrate when the glass substrate is removed via laser irradiation. In particular, when the metal dummy patterns are provided under ITO wires, which pass through the edge of the flexible film, it is possible to prevent dispersion of particles from the ITO wires due to reaction with a laser.

In addition, the metal dummy patterns of the present invention are formed in the same layer as a metal mesh that constitutes the lower portion of an electrode of a touch electrode array, which may obviate the addition of any materials or masks.

A flexible display device of the present invention may be used in a configuration in which a flexible film is first patterned and in a subsequent process of removing a glass substrate, a structure around the flexible film is removed therewith by external physical force, in order to make the device slim. In the flexible display device, the edge structure of the flexible film may be changed to minimize the generation of particles on the cut plane of the flexible film, thereby preventing damage to the periphery of the flexible film.

The above-described features, configurations, effects, and the like are included in at least one of the embodiments of the present invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as being included in the scope and spirit of the present invention.

It will be apparent to those skilled in the art that various modifications and variations can be made in the flexible display device of the present invention without departing from the spirit or scope of the invention. Thus, it is intended that the present invention cover the modifications and variations of this invention provided they come within the scope of the appended claims and their equivalents.

What is claimed is:
1. A flexible display device, comprising:
a flexible film, which is divided into an active area and a dead area around the active area;
an electrode array provided in the active area of the flexible film;
a pad portion provided in the dead area of the flexible film and having a plurality of pad electrodes;
a routing wire configured to connect the electrode array and the pad electrodes;
a plurality of transparent dummy electrode wires provided from the pad electrodes to an edge of the flexible film; and
a plurality of dummy metal patterns, wherein each of the dummy metal pattern is in contact one-to-one with the transparent dummy electrode wires and is provided to the edge of the flexible film by a width greater than a width of each of the transparent dummy electrode wire.

2. The flexible display device according to claim 1, wherein each of the dummy metal patterns is spaced apart from each of the pad electrodes by a predetermined distance.

3. The flexible display device according to claim 1, further comprising an inorganic buffer layer between the flexible film and the dummy metal patterns.

4. The flexible display device according to claim 1, wherein each of the dummy metal patterns is located under each of the transparent dummy electrode wires.

5. The flexible display device according to claim 4, wherein the electrode array includes a first electrode and a second electrode, which are formed of double layers including a metal mesh and a transparent electrode configured to cover the metal mesh.

6. The flexible display device according to claim 5, wherein the metal mesh is the same layer as the dummy metal patterns, and
wherein the transparent electrode is the same layer as the transparent dummy electrode wires.

7. The flexible display device according to claim 4, wherein the routing wire includes a first layer, which is the same layer as the dummy metal patterns, and a second layer, which is the same layer as the transparent dummy electrode wires, and
wherein the second layer has a width greater than a width of the first layer.

8. The flexible display device according to claim 1, wherein each of the dummy metal patterns is a stack of a Cu layer and a MoTi layer, and each of the transparent dummy electrode wires is a single layer formed of any one selected from among ITO, IZO, ITZO and IGZO.

9. A flexible display device, comprising:
a first flexible film, which is divided into an active area and a dead area around the active area;
a touch electrode array provided in the active area of the first flexible film;
a touch pad portion provided in the dead area of the first flexible film and having a plurality of touch pad electrodes;
a routing wire configured to connect the touch electrode array and the touch pad electrodes;
a plurality of transparent dummy electrode wires provided from the touch pad electrodes to an edge of the first flexible film;
a plurality of dummy metal patterns, wherein each of the dummy metal pattern is in contact one-to-one with the transparent dummy electrode wires and is provided to the edge of the first flexible film by a width greater than a width of each of the transparent dummy electrode wires;
a second flexible film having a thin-film transistor and an organic light-emitting diode array disposed so as to face the touch electrode array; and
an adhesive layer between the organic light-emitting diode array and the touch electrode array.

10. The flexible display device according to claim 9, further comprising a dummy pad portion provided on the second flexible film to correspond to the touch pad portion.

11. The flexible display device according to claim 10, wherein the touch pad portion and the dummy pad portion are connected to each other by an anisotropic conductive film.

12. The flexible display device according to claim 9, wherein each of the dummy metal patterns is spaced apart from each of the touch pad electrodes by a predetermined distance.

13. The flexible display device according to claim 9, further comprising an inorganic buffer layer between the flexible film and the dummy metal patterns.

14. The flexible display device according to claim 9, wherein each of the dummy metal patterns is located under each of the transparent dummy electrode wire.

15. The flexible display device according to claim 14, wherein the touch electrode array includes a first electrode and a second electrode, which are formed of double layers including a metal mesh and a transparent electrode configured to cover the metal mesh.

16. The flexible display device according to claim 15, wherein the metal mesh is the same layer as the dummy metal patterns, and
wherein the transparent electrode is the same layer as the transparent dummy electrode wires.

17. The flexible display device according to claim 14, wherein the routing wire includes a first layer, which is the same layer as the dummy metal patterns, and a second layer, which is the same layer as the transparent dummy electrode wires, and
wherein the second layer has a width greater than a width of the first layer.

18. The flexible display device according to claim 9, wherein each of the dummy metal patterns is a stack of a Cu layer and a MoTi layer, and each of the transparent dummy electrode wires is a single layer formed of any one selected from among ITO, IZO, ITZO and IGZO.

* * * * *